(12) United States Patent
Liu

(10) Patent No.: US 10,778,081 B2
(45) Date of Patent: Sep. 15, 2020

(54) RIPPLE COMPENSATION FOR BURST MODE CONTROL

(71) Applicant: TEXAS INSTRUMENTS INCORPORATED, Dallas, TX (US)

(72) Inventor: Pei-Hsin Liu, Westford, MA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/183,439

(22) Filed: Nov. 7, 2018

(65) Prior Publication Data

US 2019/0260284 A1 Aug. 22, 2019

Related U.S. Application Data

(60) Provisional application No. 62/633,141, filed on Feb. 21, 2018.

(51) Int. Cl.
| | |
|---|---|
| *H02M 3/335* | (2006.01) |
| *H02M 1/14* | (2006.01) |
| *H03K 3/78* | (2006.01) |
| *H02M 1/15* | (2006.01) |
| *H02M 1/00* | (2006.01) |

(52) U.S. Cl.
CPC ............ *H02M 1/143* (2013.01); *H02M 1/15* (2013.01); *H02M 3/33507* (2013.01); *H03K 3/78* (2013.01); *H02M 2001/0035* (2013.01)

(58) Field of Classification Search
None
See application file for complete search history.

(56) References Cited

U.S. PATENT DOCUMENTS

| | | | | |
|---|---|---|---|---|
| 6,181,120 B1* | 1/2001 | Hawkes | ............... | H02M 3/156 323/282 |
| 10,135,341 B1* | 11/2018 | Liu | ................... | H02M 3/33507 |
| 2008/0130324 A1* | 6/2008 | Choi | ................. | H02M 3/33507 363/21.03 |
| 2012/0146606 A1* | 6/2012 | Li | ......................... | H02M 3/156 323/283 |
| 2013/0107585 A1* | 5/2013 | Sims | ................. | H02M 3/33592 363/21.14 |
| 2014/0099139 A1* | 4/2014 | Kojima | ............. | H02M 3/33515 399/88 |
| 2014/0292300 A1* | 10/2014 | Yan | ........................ | H02M 3/157 323/288 |

* cited by examiner

*Primary Examiner* — Jeffrey A Gblende
(74) *Attorney, Agent, or Firm* — Mark Allen Valetti; Charles A. Brill; Frank D. Cimino

(57) ABSTRACT

A device includes a pulse generation circuit configured to cause a primary side of a flyback converter to generate a burst of pulses while a signal is enabled, a set-reset latch configured to output the signal and to reset in response to a number of pulses in the burst approaching a threshold, a comparator configured to set the set-reset latch when a compensated feedback voltage reaches a reference voltage, and a ripple compensation circuit configured to adjust a feedback voltage from a secondary side of the flyback converter by a compensation voltage to generate the compensated feedback voltage.

18 Claims, 9 Drawing Sheets

RIPPLE COMPENSATION FOR BURST MODE CONTROL

CROSS-REFERENCE TO RELATED APPLICATIONS

The present application claims priority to U.S. Provisional Patent Application No. 62/633,141, which was filed Feb. 21, 2018, is titled "Active Ripple Compensation To Stabilize Burst Mode Control," and is hereby incorporated herein by reference in its entirety.

SUMMARY

In accordance with at least one example of the disclosure, a device includes a pulse generation circuit configured to cause a primary side of a flyback converter to generate a burst of pulses while a signal is enabled, a set-reset latch configured to output the signal and to reset in response to a number of pulses in the burst approaching a threshold, a comparator configured to set the set-reset latch when a compensated feedback voltage reaches a reference voltage, and a ripple compensation circuit configured to adjust a feedback voltage from a secondary side of the flyback converter by a compensation voltage to generate the compensated feedback voltage.

In accordance with another example of the disclosure, a device includes a set-reset latch having an output coupled to a counter, a set input, and a reset input coupled to the counter. The device also includes a ripple compensation circuit including a switching element having a control terminal coupled to the output of the set-reset latch, a capacitor in parallel with the switching element, and a first resistor coupled to the switching element and the capacitor. The device further includes an output voltage feedback circuit configured to couple to a flyback converter, the output voltage feedback circuit comprising an optocoupler coupled to the first resistor. The device still further includes a comparator including a first input coupled to a first voltage source, a second input coupled to the first resistor and a second resistor, and an output coupled to the set input of the set-reset latch.

In accordance with yet another example of the disclosure, a device includes a set-reset latch having an output coupled to a counter, a set input, and a reset input coupled to the counter. The device also includes a ripple compensation circuit including a switching element having a control terminal coupled to the output of the set-reset latch; a capacitor; a voltage limiter, wherein the switching element, the capacitor, and the voltage limiter are arranged in parallel between a first node and ground; and a current source coupled to the first node. The device further includes a comparator having a first input coupled to a first voltage source and the first node, a second input coupled to a first resistor, and an output coupled to the set input of the set-reset latch.

In accordance with still another example of the disclosure, a method includes generating, by a primary side of a flyback converter, a burst of pulses while a signal is enabled. The method also includes disabling the signal in response to a number of pulses in the burst approaching a threshold, shifting a feedback voltage by a compensation voltage to generate a compensated feedback voltage, and enabling the signal when the compensated feedback voltage reaches a reference voltage.

BRIEF DESCRIPTION OF THE DRAWINGS

For a detailed description of various examples, reference will now be made to the accompanying drawings in which.

DETAILED DESCRIPTION

Burst-mode control for a power converter, such as a flyback converter, allows the power converter to operate at a higher average efficiency, which is required to meet certain governmental standards (e.g., those of the Department of Energy for power converter efficiency). Burst-mode control relies on a feedback voltage from a secondary side of the power converter to trigger a subsequent burst of pulses by a primary side of the power converter. However, the feedback voltage has a low signal-to-noise ratio (SNR), and thus noise causes the feedback voltage to prematurely cross a voltage threshold and prematurely trigger a subsequent burst of pulses. As a result, bursts of pulses are grouped too closely together, which lowers the effective frequency of the power converter. For example, when what should have been four consecutive, equally-spaced bursts becomes a first set of two closely-grouped bursts and a second set of two closely-grouped bursts, the effective frequency is approximately reduced by half. In some examples, reducing the effective frequency of the power converter causes audible noise, which can lead to failing noise regulations. Additionally, irregular grouping of bursts increases output voltage ripple, which is undesirable.

An example of the present disclosure that addresses the foregoing problems includes a ripple compensation circuit to shift the feedback voltage relative to the voltage threshold by a compensation voltage, generating a compensated feedback voltage. The compensated feedback voltage is then compared to the voltage threshold. When the compensated feedback voltage reaches the voltage threshold, a subsequent burst of pulses is generated by the primary side of the converter. In effect, the ripple compensation circuit shifts the feedback voltage, including noise and/or harmonic ringing components caused by an output filter, away from the voltage threshold to reduce the likelihood of the noise or harmonic ringing prematurely triggering a subsequent burst of pulses. In some examples, the compensation voltage is a semi-square waveform in that it comprises a sharp leading edge and a gently-sloping trailing edge. Further, the ripple compensation circuit is configurable to adjust the amplitude of the compensation voltage (leading edge) and the decay rate (trailing edge). The examples of the present disclosure effectively enhance the noise immunity and stability margin across various output filter designs while allowing for a reduction in size of capacitor(s) used in the output filter.

Figure 1A:
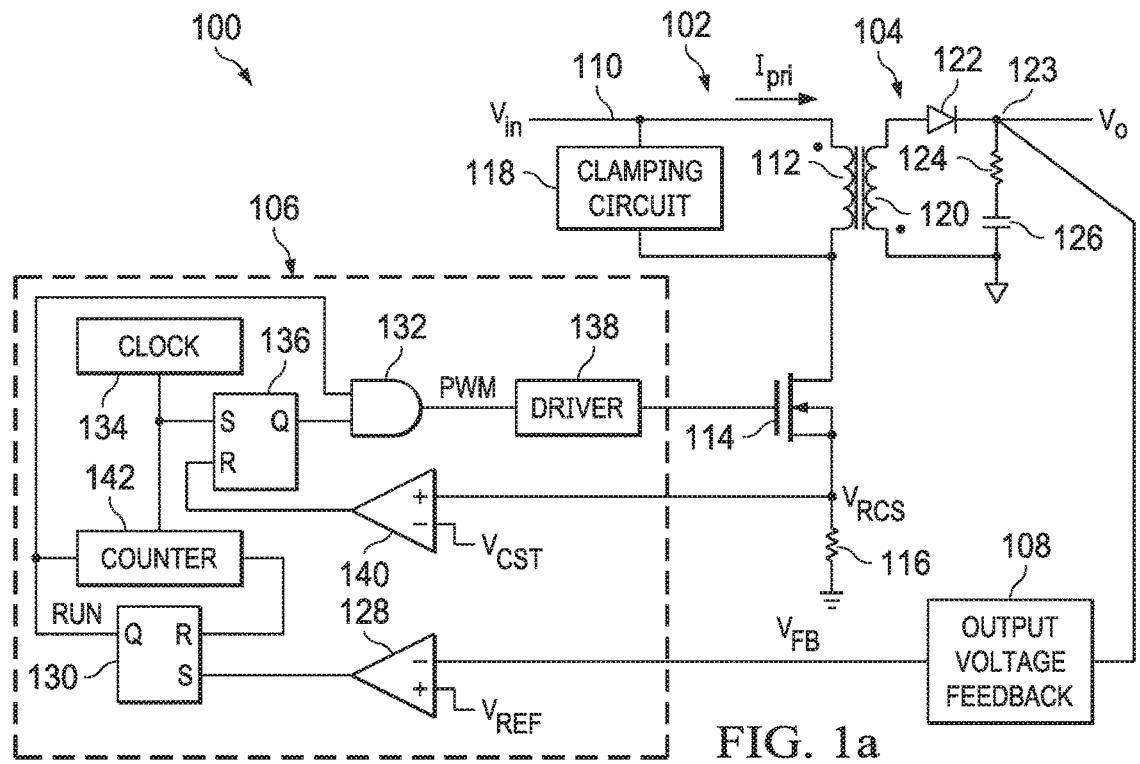
FIG. 1a shows a circuit schematic diagram of a flyback converter and a burst-mode controller in accordance with various examples.

FIG. 1a depicts a system 100 including a flyback converter and a burst-mode controller 106 for the flyback converter. The flyback converter includes a primary (or input) side 102 and a secondary (or output) side 104, and is part of, for example, a power adapter for an electronic device such as a laptop computer or mobile phone device. An output voltage feedback circuit 108 provides a feedback loop from the output voltage ($V_O$) of the secondary side 104 to the burst-mode controller 106 to control the primary side 102.

An input voltage source 110 provides an alternating current (AC) voltage $V_{IN}$ to the primary side 102. The primary side 102 includes primary transformer windings 112, which are coupled to the input voltage source 110. An n-type metal-oxide-semiconductor field effect transistor (MOSFET) 114 drain is coupled to the primary transformer windings 112, while a source of the n-type MOSFET 114 is coupled to a ground terminal by way of a current sense resistor 116, having a resistance value of $R_{CS}$. The primary side 102 also includes a clamping circuit 118, which prevents the maximum drain-to-source voltage of the n-type MOSFET 114 from exceeding a safe operating range.

The secondary side 104 includes secondary transformer windings 120, which are electromagnetically coupled to the primary transformer windings 112. A diode 122 couples the secondary transformer windings 120 to an output voltage node 123, which provides a voltage $V_O$ to the electronic device. The output voltage node 123 is coupled to a resistor 124, which in turn couples to a capacitor 126, which in turn couples to a ground terminal. The resistor 124 and capacitor 126 form an example output voltage filtering circuit.

As explained, the output voltage feedback circuit 108 is coupled to the output voltage node 123, and produces a feedback voltage, the value of which is $V_{FB}$. The burst-mode controller 106 includes a comparator 128 that compares $V_{FB}$ to a reference voltage ($V_{REF}$). The output of the comparator 128 is coupled to a set-reset latch 130, specifically to a set input of the set-reset latch 130. A non-inverted output (Q) of the set-reset latch 130 is provided to AND gate 132. The Q output of the set-reset latch 130 is also referred to as a RUN signal, the impact of which will be explained in further detail below.

The burst-mode controller 106 also includes a clock generator 134 to generate a clock signal, which is provided to a set input of another set-reset latch 136. A non-inverted output (Q) of the set-reset latch 136 is also provided to AND gate 132. The clock signal is also provided to a counter 142, which also receives the RUN signal as input, and counts a number of clock pulses while the RUN signal is enabled. The output of the counter 142 is triggered in response to counting a certain number of clock pulses while the RUN signal is enabled, and this output is provided to a reset input of the set-reset latch 130.

The burst-mode controller 106 includes another comparator 140 that compares a voltage across the current sense resistor 116, given by $V_{RCS}$, with a current sense voltage threshold, given by $V_{CST}$. An output of the comparator 140 is provided to a reset input of the set-reset latch 136. An output of the AND gate 132 is coupled to a gate driver 138 that drives a gate of the n-type MOSFET 114 to a level such that the n-type MOSFET 114 operates in a low-impedance state.

Figure 1B:
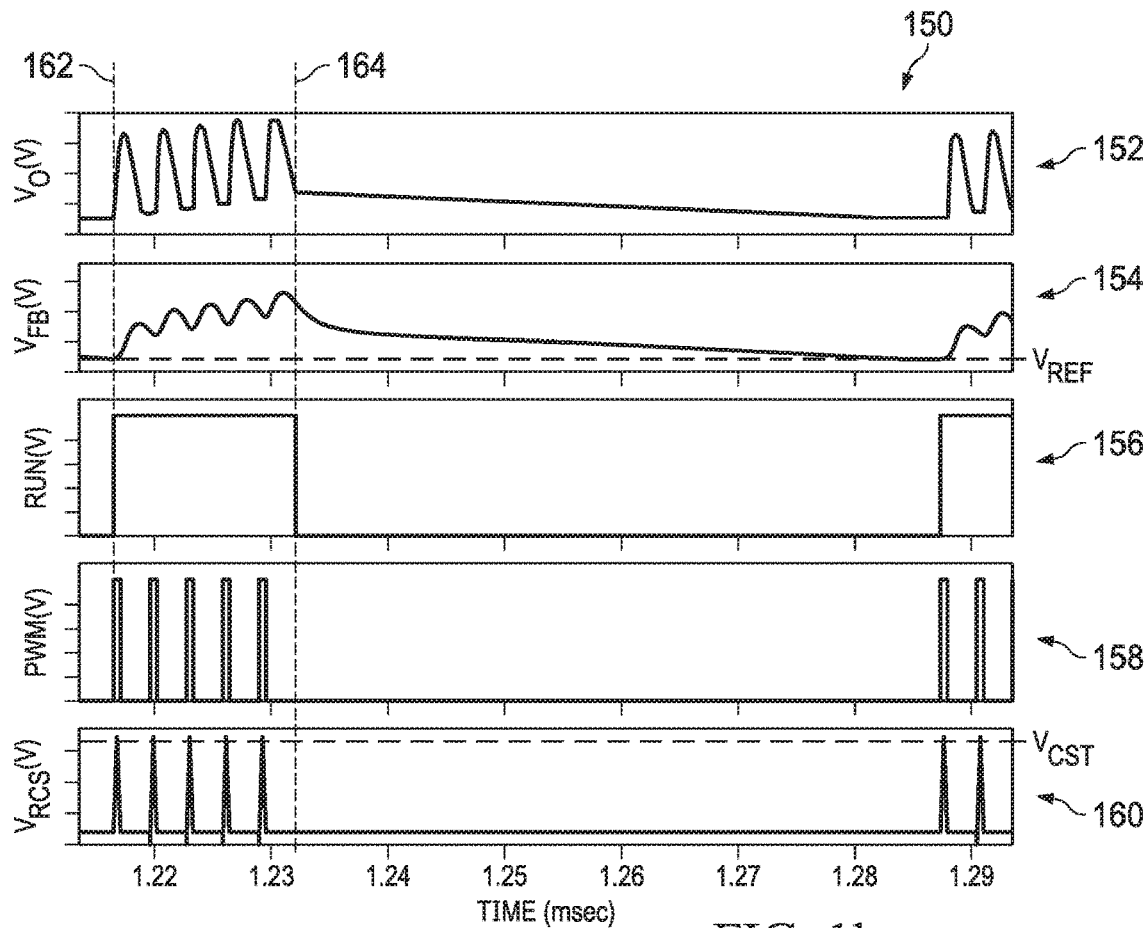
FIG. 1b shows a set of waveforms associated with FIG. 1a in accordance with various examples.

FIG. 1b shows a set of waveforms 150 associated with various aspects of the system 100 of FIG. 1a. The first waveform 152 corresponds to the output voltage $V_O$. The second waveform 154 corresponds to the feedback voltage $V_{FB}$ shown relative to the reference voltage $V_{REF}$. The third waveform 156 corresponds to the RUN signal. The fourth waveform 158 corresponds to the input to the gate driver 138 (notated PWM, also the output of the AND gate 132). The fifth waveform 160 corresponds to the voltage across the current sense resistor 116 $V_{RCS}$ shown relative to the current sense threshold $V_{CST}$.

At time 162, $V_{FB}$ reaches $V_{REF}$, which trips the comparator 128 and sets the set-reset latch 130, causing the RUN signal to be high. As a result of $V_{RCS}$ initially being less than $V_{CST}$, the set-reset latch 136 is set by the clock signal generated by the clock generator 134, causing the output of the AND gate 132, which also receives the RUN signal, to be high. While the output of the AND gate 132 (PWM) is high, the gate driver 138 drives the gate of the n-type MOSFET 114, turning the n-type MOSFET 114 on.

When the n-type MOSFET 114 is on, $V_{IN}$ is applied to the primary transformer windings 112 and current through the n-type MOSFET 114 and the current sense resistor 116 increases. During this time, the secondary side diode 122 is reverse biased, the voltage applied across the diode 122 is equal to $V_O$ plus a reflected input voltage ($V_{IN}$×secondary windings/primary windings), and the load current is supplied by the output capacitor 126. As the current through the current sense resistor 116 increases, $V_{RCS}$ also increases as shown in the waveform 160. As a result of $V_{RCS}$ reaching $V_{CST}$, the comparator 140 trips, resetting the set-reset latch 136, and causing PWM to go low. During this time, energy stored in the transformer transfers to the secondary windings 120 causing current to flow through the diode 122, which is now forward biased. The current flowing through the diode 122 replenishes the capacitor 126 and supplies an output load. $V_{FB}$ does not fall below $V_{REF}$ after one pulse and thus the RUN signal remains high, so the next clock pulse from the clock generator 134 again causes PWM to go high, and the above functionality is repeated.

In the example of FIG. 1b, the burst length is five pulses. In other words, the output of the counter 142 is triggered after five clock pulses are received from the clock generator 134 while the RUN signal is enabled. Thus, at time 164, the counter 142 is triggered and resets the set-reset latch 130, causing the RUN signal to go low, which in turn forces PWM low. During this period of inactivity, $V_{FB}$ decays until it eventually reaches $V_{REF}$, at which point the comparator 128 trips, the RUN signal goes high, and the above functionality is repeated. While not explicitly shown in FIG. 1b, the feedback voltage signal has a low SNR. As a result, particularly later in the period of decay following the time 164, noise present in the feedback voltage signal causes $V_{FB}$ to prematurely reach $V_{REF}$, which begins the subsequent burst cycle prematurely. Additionally, in some cases certain output filter configurations, such as a pi filter (described in further detail below), produce harmonic ringing in the feedback voltage signal. This harmonic ringing can also cause $V_{FB}$ to prematurely reach $V_{REF}$, beginning the subsequent burst cycle prematurely. In either case, output voltage ripple increases and/or audible noise increases due to an effective reduction in frequency when multiple bursts are closely grouped together, neither of which is desirable.

Figure 2A:
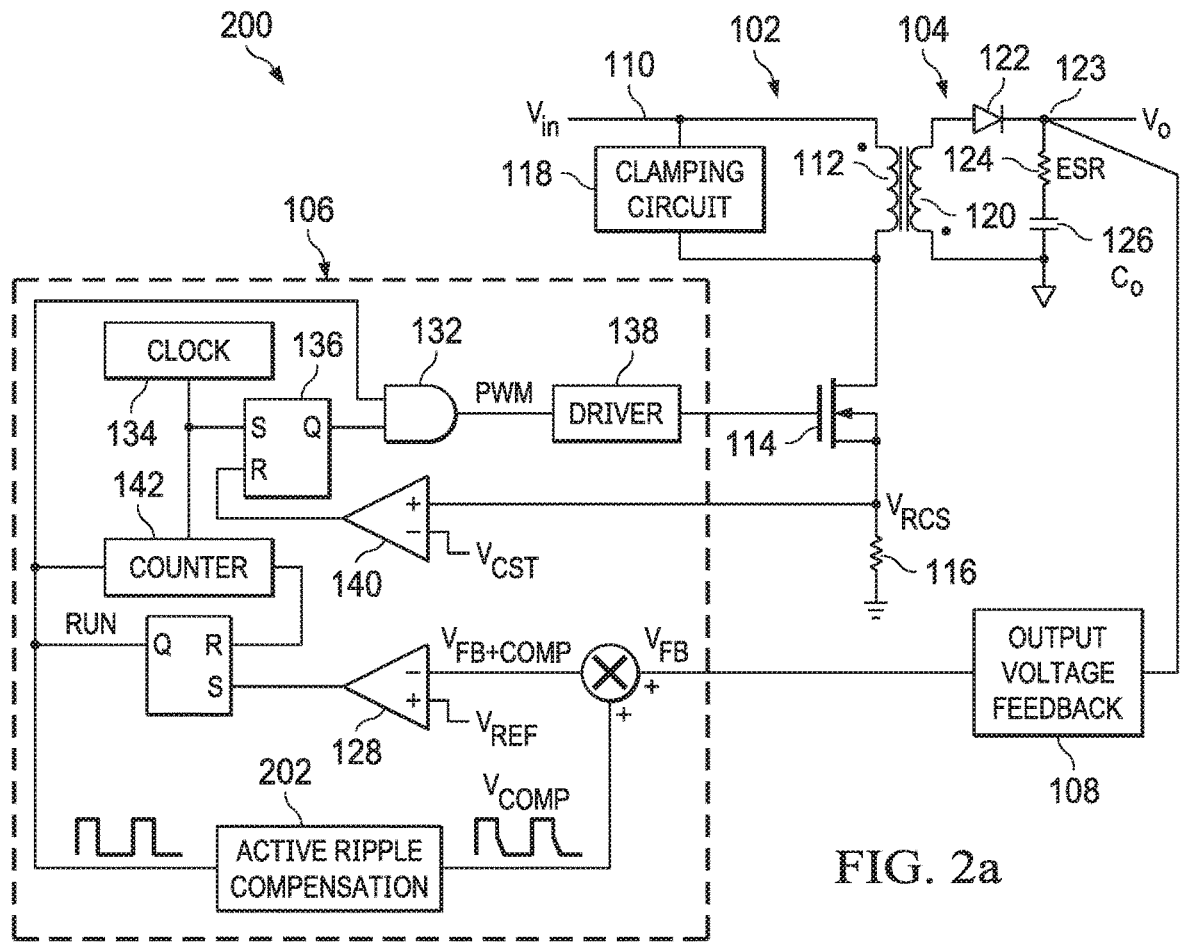
FIG. 2a shows a circuit schematic diagram of a flyback converter and a burst-mode controller with ripple compensation in accordance with various examples.

FIG. 2a shows a system 200 in accordance with examples of the present disclosure. Components that are like-numbered to those in FIG. 1a have the same functionality as described above. The system 200 includes a ripple compensation circuit 202 that receives the RUN signal as input, and generates a compensation voltage, the value of which is $V_{COMP}$ as output. In particular, the ripple compensation circuit 202 generates the compensation voltage while the RUN signal is enabled. In this example, $V_{COMP}$ is added to $V_{FB}$ to produce a compensated feedback voltage, the value of which is $V_{FB+COMP}$, and which is used for comparison to $V_{REF}$ by the comparator 128.

Figure 2B:
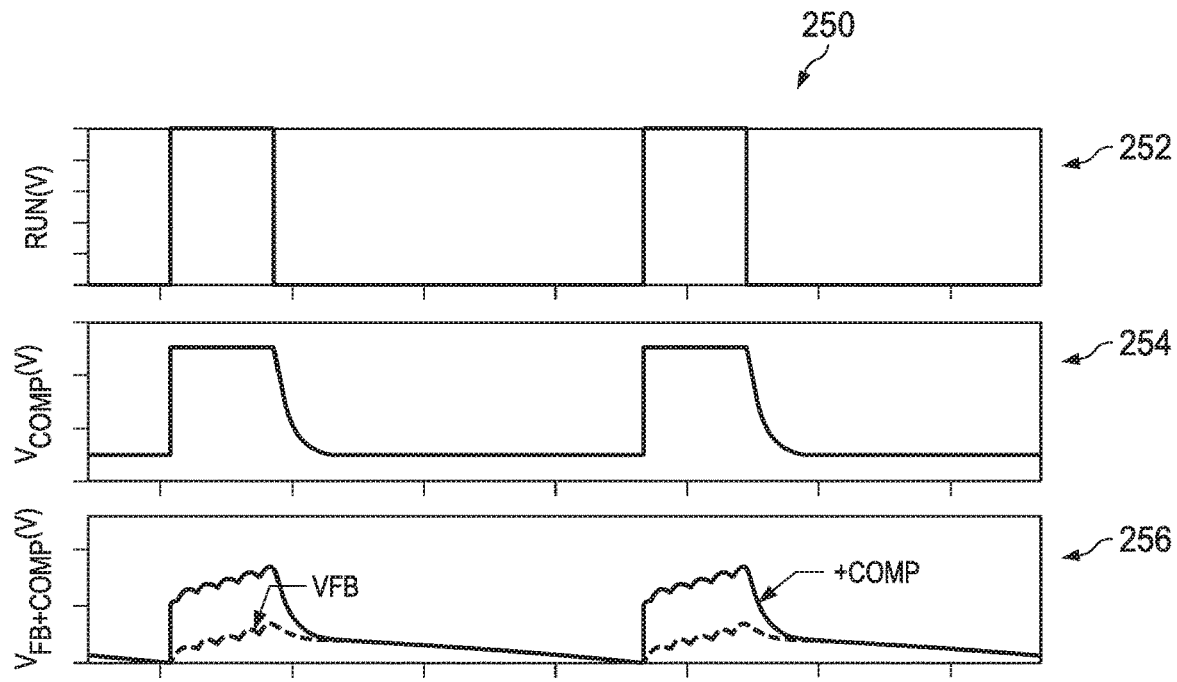
FIG. 2b shows a set of waveforms associated with FIG. 2a in accordance with various examples.

FIG. 2b shows a set of waveforms 250 associated with various aspects of the system 200 of FIG. 2a. The first waveform 252 corresponds to the RUN signal. The second waveform 254 shows $V_{COMP}$. The third waveform 256 shows $V_{FB}$ and the resulting summation of $V_{FB+COMP}$, which is shifted in the positive direction relative to $V_{FB}$. In this example, it is assumed that the x-axis of the third waveform 256 also corresponds to $V_{REF}$. When the RUN signal is enabled, the ripple compensation circuit 202 generates $V_{COMP}$, which in an example is a semi-square waveform with a sharp leading edge, and a more gradually-sloping trailing edge. As demonstrated in the third waveform 256, the resultant summation of $V_{FB+COMP}$ is shifted by the amplitude of $V_{COMP}$, but still decays in a way that $V_{COMP}$ does not overwhelm the underlying $V_{FB}$ component. As a result, the subsequent burst is still triggered at a desired time, while reducing the likelihood of noise interfering (with a comparison to $V_{REF}$) to trigger a premature burst. As will be explained further below, the ripple compensation circuit 202 is configured to permit adjustment to both the amplitude and the decay rate or profile of $V_{COMP}$.

Figure 3A:
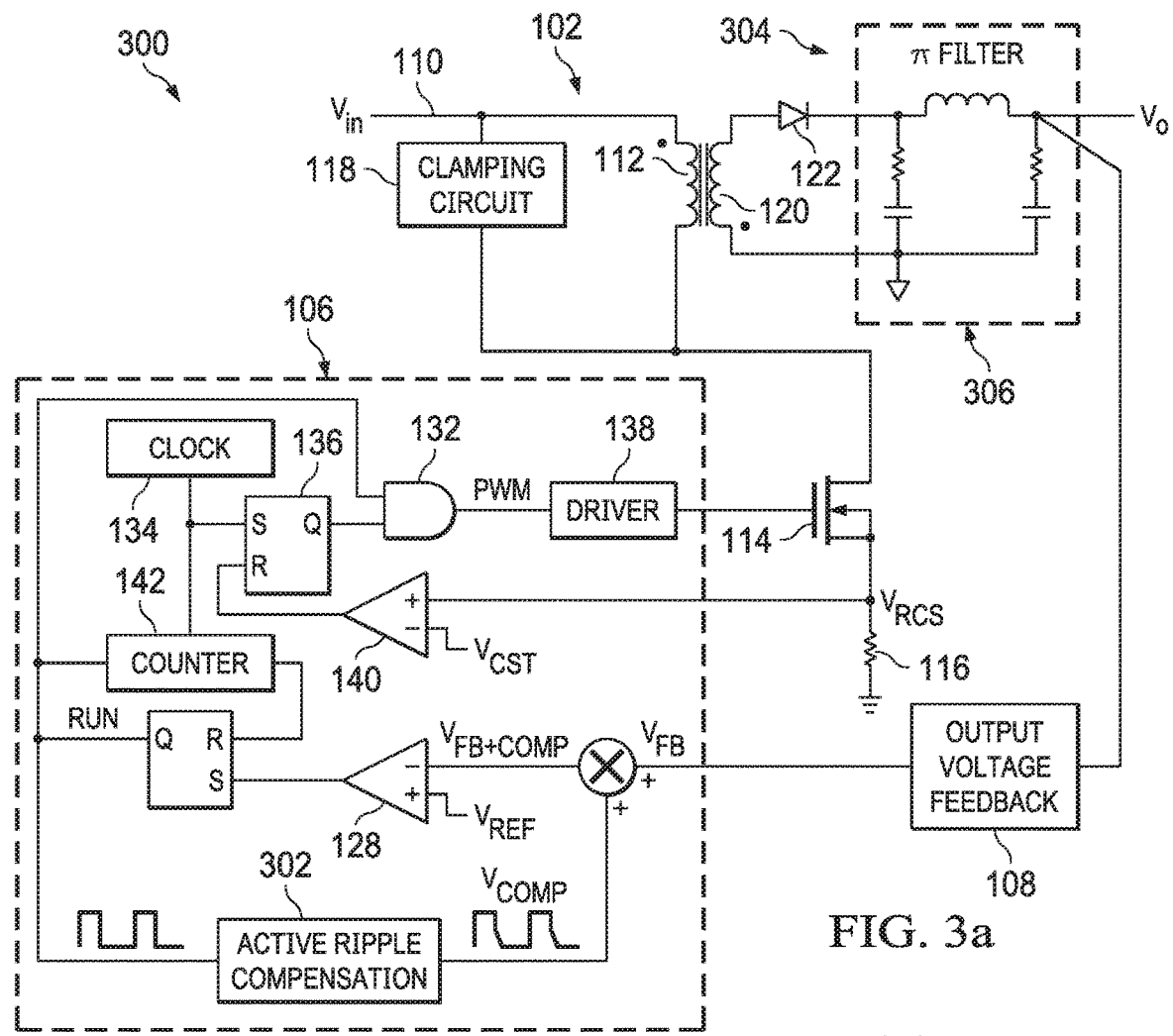
FIG. 3a shows another circuit schematic diagram of a flyback converter and a burst-mode controller with ripple compensation in accordance with various examples.

FIG. 3a shows a system 300 in accordance with examples of the present disclosure. Components that are like-numbered to those in FIG. 1a have the same functionality as described above. The system 300 includes a ripple compensation circuit 302 that receives the RUN signal as input, and generates a compensation voltage, the value of which is $V_{COMP}$ as output. In particular, the ripple compensation circuit 302 generates the compensation voltage while the RUN signal is enabled. In this example, $V_{COMP}$ is added to $V_{FB}$ to produce a compensated feedback voltage, the value of which is $V_{FB+COMP}$, and which is used for comparison to $V_{REF}$ by the comparator 128. The system 300 differs from the systems 100, 200 described above in that a secondary side 304 of the system 300 includes a pi filter 306, rather than the combination of resistor 124 and capacitor 126 of those systems 100, 200. In this example, a different output filter type is utilized to demonstrate the adjustability of the ripple compensation circuit 302.

Figure 3B:
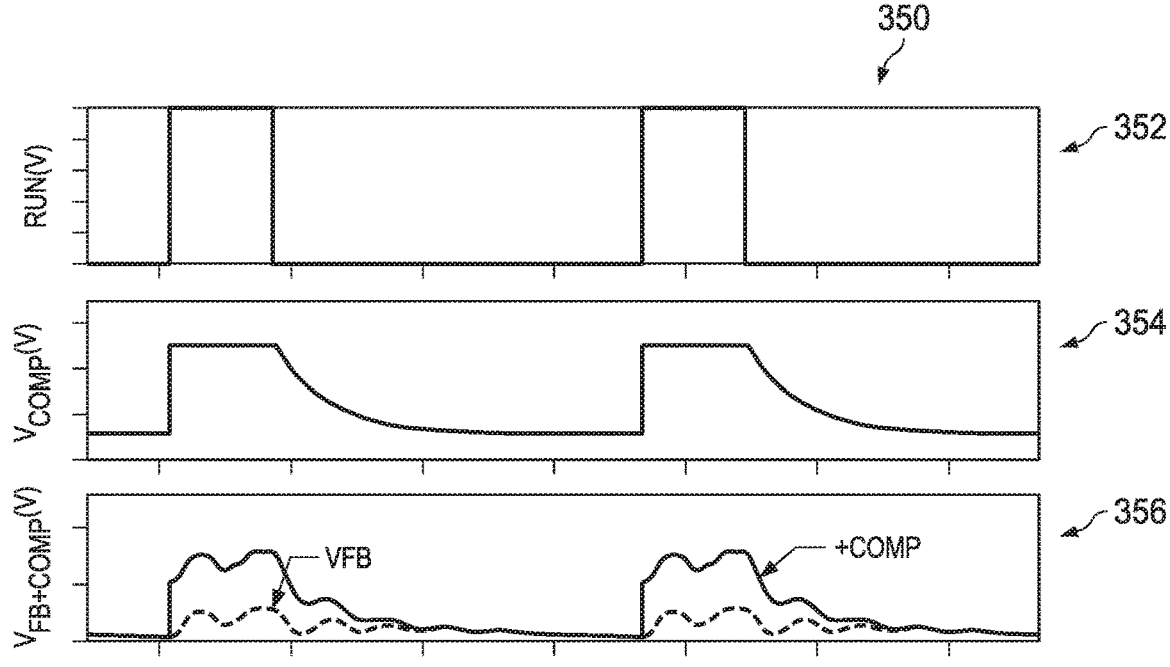
FIG. 3b shows a set of waveforms associated with FIG. 3a in accordance with various examples.

FIG. 3b shows a set of waveforms 350 associated with various aspects of the system 300 of FIG. 3a. The first waveform 352 corresponds to the RUN signal. The second waveform 354 shows $V_{COMP}$. The third waveform 356 shows $V_{FB}$ and the resulting summation of $V_{FB+COMP}$, which is shifted in the positive direction relative to $V_{FB}$. In this example, it is assumed that the x-axis of the third waveform 356 also corresponds to $V_{REF}$. When the RUN signal is enabled, the ripple compensation circuit 302 generates $V_{COMP}$, which in an example is a semi-square waveform with a sharp leading edge, and a more gradually-sloping trailing edge. As demonstrated in the third waveform 356, the resultant summation of $V_{FB+COMP}$ is shifted by the amplitude of $V_{COMP}$, but still decays in a way that $V_{COMP}$ does not overwhelm the underlying $V_{FB}$ component. As a result, the subsequent burst is still triggered at a desired time, while reducing the likelihood of noise interfering (with a comparison to $V_{REF}$) to trigger a premature burst.

FIG. 3b differs from FIG. 2b with respect to the profile of the decay of $V_{COMP}$. In particular, the pi filter 306 has a tendency to introduce a harmonic ringing component to the feedback voltage, as demonstrated by the somewhat more erratic behavior of $V_{FB}$ in third waveform 356 (relative to the regular pattern of $V_{FB}$ in the waveform 256 of FIG. 2b). As a result of the harmonic ringing continuing even after the RUN signal is disabled, the profile of $V_{COMP}$ has been adjusted to contain a more gradual decay, which has the effect of keeping the combined $V_{FB+COMP}$ shifted away from $V_{REF}$ for a longer duration of time (until the harmonic ringing is likely to have subsided). Thus, the likelihood of the harmonic ringing prematurely reaching $V_{REF}$ and prematurely triggering a subsequent burst is reduced.

Figure 4A:
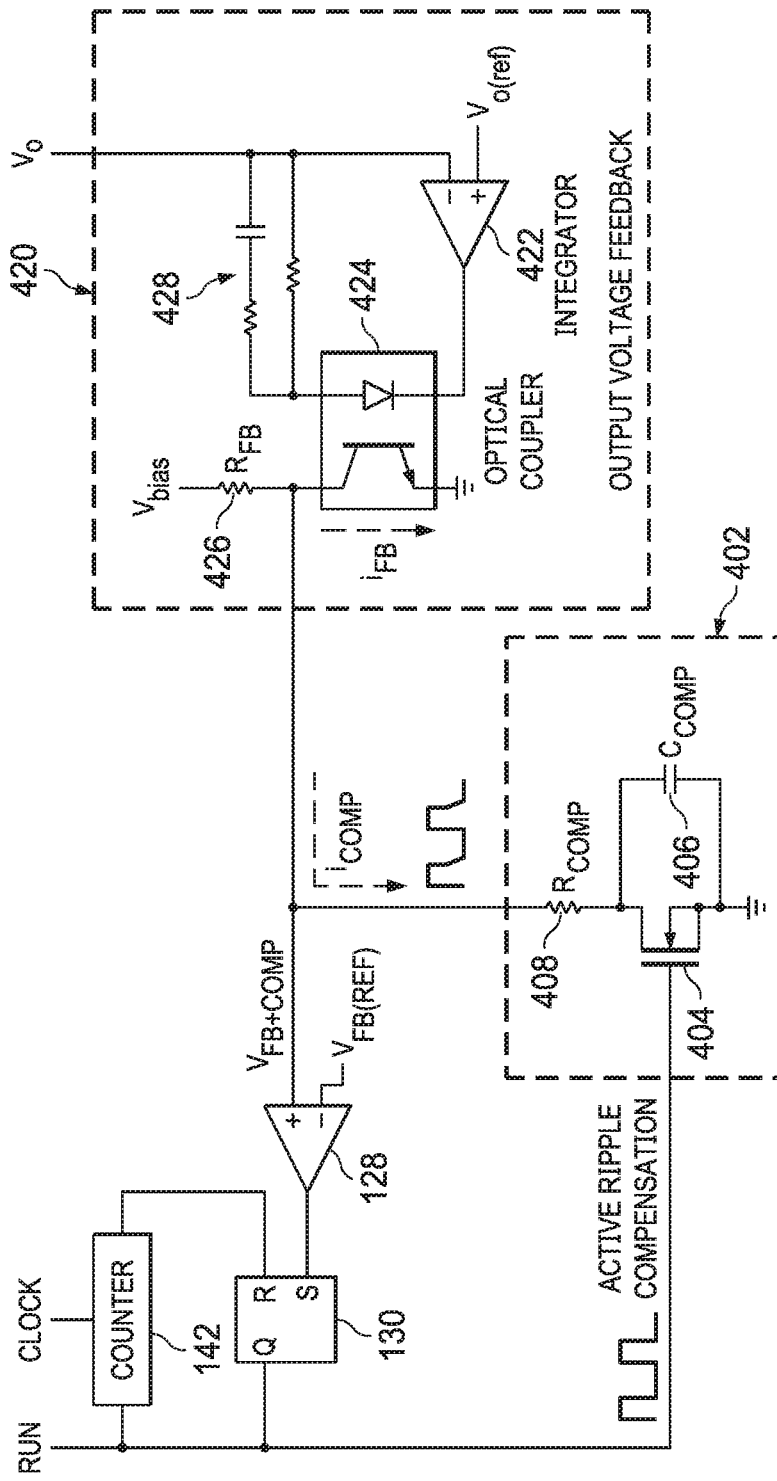
FIG. 4a shows a circuit schematic diagram of a first implementation of a ripple compensation scheme in accordance with various examples.

FIG. 4a shows an example ripple compensation circuit 402 in further detail, which is representative of the ripple compensation circuits 202, 302 explained above. Additionally, an example output voltage feedback circuit 420 is shown in further detail. The ripple compensation circuit 402 includes a switching element 404, which in this example is an n-type MOSFET having its source coupled to ground, its gate coupled to the non-inverting Q output of latch 130, and its drain coupled to a compensation resistor 408 having a resistance $R_{COMP}$. The ripple compensation circuit 402 also includes a capacitor 406 in parallel with the switching element 404. In one example, the capacitor 406 is a separate element from the switching element 404, while in another example, the capacitor 406 is a representation of the junction capacitance of an n-type MOSFET. In other examples, the switching element 404 is a NPN bipolar junction transistor (BJT) having its base coupled to the non-inverting Q output of latch 130, its collector coupled to the compensation resistor 408, and its emitter coupled to ground. The compensation resistor 408 is also coupled to the non-inverting terminal of the comparator 128, and to the output voltage feedback circuit 420.

The output voltage feedback circuit 420 includes an integrator 422 to derive an error between $V_O$ and an output reference voltage, the value of which is $V_{O(ref)}$, which is a regulation target voltage for $V_O$. The output of the integrator 422 is coupled to an optocoupler 424, which generates a feedback current signal, the value of which is $i_{FB}$, having a magnitude proportional to the magnitude of the error between $V_O$ and $V_{O(ref)}$. A feedback resistor 426, which is a pull-up resistor in this example, is coupled to a bias voltage source ($V_{bias}$) and to the optocoupler 424. The feedback resistor 426 value is given by $R_{FB}$. In some examples, a resistor-capacitor (RC) compensation network 428 compensates for a phase delay of the optocoupler 424 to reduce any phase shift between $V_O$ ripple and the resultant $i_{FB}$ ripple.

When the RUN signal is enabled, the switching element 404 turns on and a compensation current $i_{COMP}$, which has a magnitude that varies depending on the value of $R_{COMP}$, flows through the ripple compensation circuit 402 as shown. As explained above, the optocoupler 424 draws $i_{FB}$, which is proportional to the output of the integrator 422, and thus the sum of $i_{COMP}$ and $i_{FB}$ flows through the feedback resistor 426. As a result, the summed current signal becomes a voltage signal of $V_{FB+COMP}$, which is less than $V_{bias}$ as a result of the feedback resistor 426 being a pull-up resistor. In some examples, $V_{bias}$ is larger than $V_{FB(REF)}$ to provide sufficient headroom so that as $i_{COMP}$ and $i_{FB}$ trend toward zero (when RUN is not enabled), $V_{FB+COMP}$ trends toward $V_{bias}$, which trips the comparator 128 when $V_{FB+COMP}$ is greater than $V_{FB(REF)}$.

The value of $R_{COMP}$ determines the leading-edge amplitude of the semi-square wave, since a lower $R_{COMP}$ value will increase the $i_{COMP}$ offset, increasing the offset of $V_{FB+COMP}$. Similarly, when the RUN signal is not enabled, and thus the switching element 404 is off, the RC time constant of the resistor 408 and the capacitor 406 determines the rate of decay of $i_{COMP}$, which determines the trailing-edge slope or decay profile.

Figure 4B:
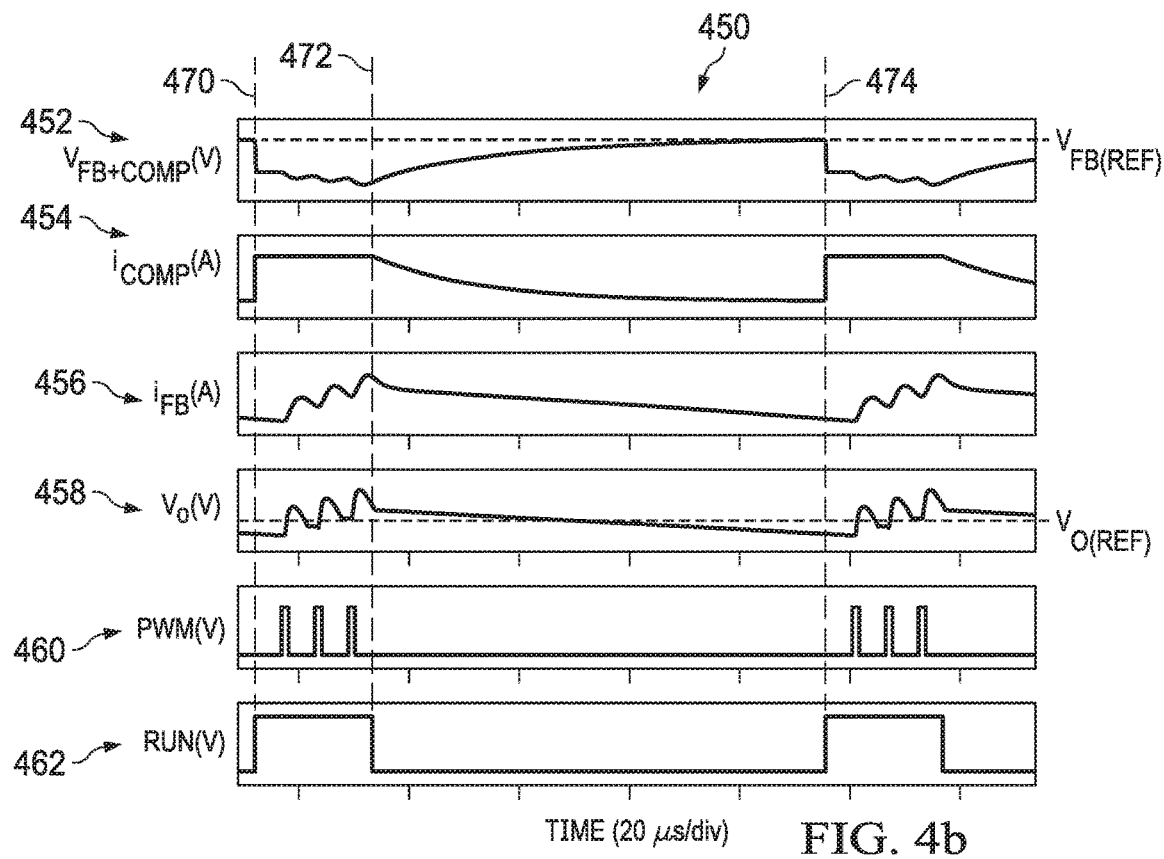
FIG. 4b shows a set of waveforms associated with FIG. 4a in accordance with various examples.

FIG. 4b shows a set of waveforms 450 associated with various aspects of FIG. 4a. The first waveform 452 corresponds to $V_{FB+COMP}$, which is shown relative to the reference voltage $V_{FB(REF)}$. The second waveform 454 shows $i_{COMP}$ while the third waveform 456 shows $i_{FB}$. The fourth waveform 458 shows the output voltage $V_O$ relative to the regulation target voltage $V_{O(ref)}$. The fifth waveform 460 corresponds to the PWM signal, while the sixth waveform 462 corresponds to the RUN signal.

In the example of FIG. 4b, the burst length is three pulses. In other words, the output of the counter 142 is triggered after three clock pulses are received from the clock generator (not shown) while the RUN signal is enabled. In this example, as a result of $V_{FB+COMP}$ being provided to the non-inverting terminal, at time 470 when $V_{FB+COMP}$ reaches or just exceeds $V_{FB(REF)}$, the set-reset latch 130 is set and the RUN signal is enabled. When the RUN signal is enabled, the switching element 404 is turned on and a current equal to $i_{COMP}+i_{FB}$ flows through the feedback resistor 426, pulling $V_{FB+COMP}$ lower as the current increases. At time 472, the counter 142 is tripped, resetting the set-reset latch 130, and the RUN signal goes low, which in turn forces PWM low. During this time, $i_{COMP}$ decays according to the RC time constant of the compensation resistor 408 and the capacitor 406, while $i_{FB}$ decays along with $V_O$. As a result, the voltage drop across the feedback resistor 426 decreases, and thus $V_{FB+COMP}$ increases until it again reaches or just exceeds $V_{FB(REF)}$ at time 474, at which point the above-described cycle repeats itself.

Figure 5B:
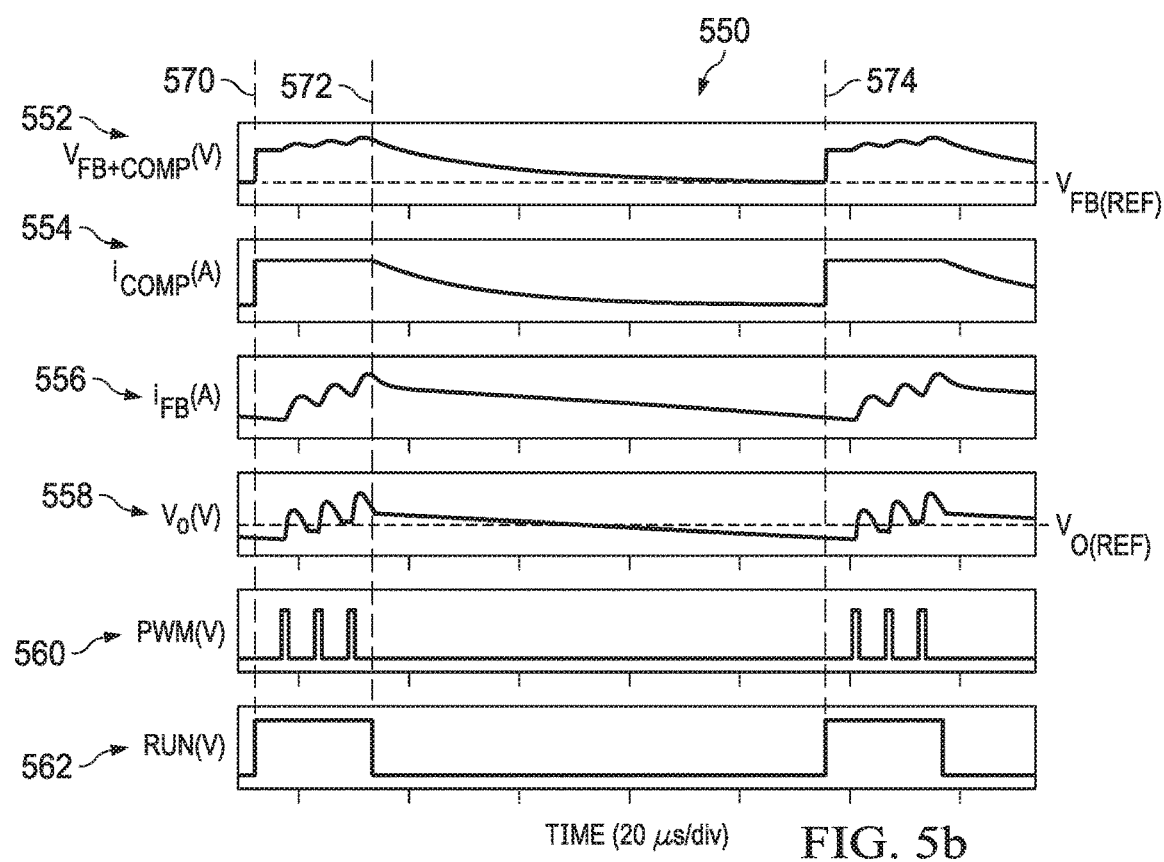
FIG. 5b shows a set of waveforms associated with FIG. 5a in accordance with various examples.
Figure 5A:
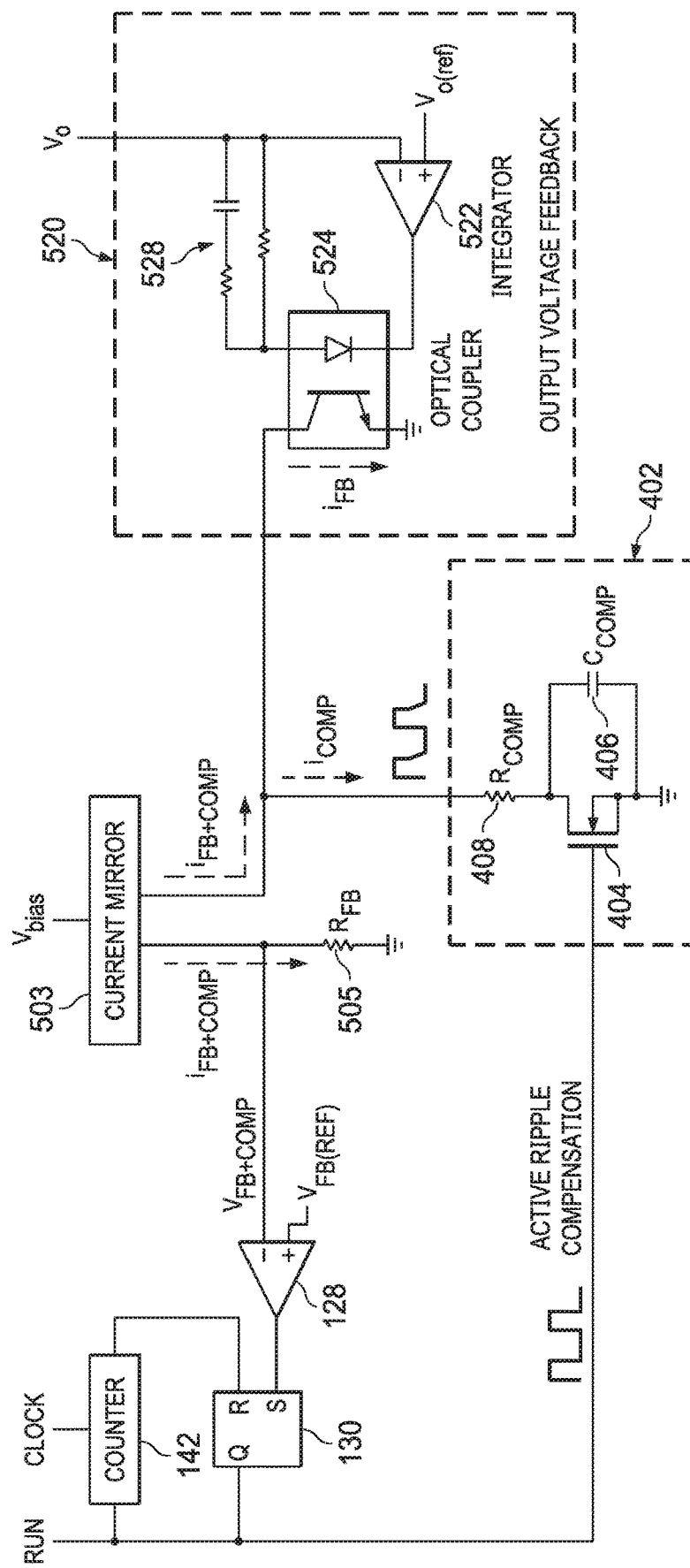
FIG. 5a shows a circuit schematic diagram of a second implementation of a ripple compensation scheme in accordance with various examples.

FIG. 5a shows the ripple compensation circuit 402 of FIG. 4a in a different implementation. The circuit 402 behaves similarly as described above. An example output voltage feedback circuit 520 is shown, including integrator 522, optocoupler 524, and RC compensation network 528, similar to those described above in FIG. 4a. The output voltage feedback circuit 520 differs from the output voltage feedback circuit 420 of FIG. 4a only in that it does not include the feedback resistor 426.

In the example of FIG. 5a, the ripple compensation circuit 402 and the output voltage feedback circuit 520 couple to one leg of a current mirror 503, which is supplied with a bias voltage ($V_{bias}$). Similar to above, the optocoupler 524 generates a feedback current signal, the value of which is $i_{FB}$, having a magnitude proportional to the magnitude of the error between $V_O$ and $V_{O(ref)}$. Also similar to above, when the RUN signal is enabled, a compensation current $i_{COMP}$ flows through the ripple compensation circuit 402 as shown. As a result, the sum of $i_{COMP}$ and $i_{FB}$ flows from each leg of the current mirror 503. In the example of FIG. 5a, a feedback resistor 505 is coupled between the current mirror 503 and ground, and thus the sum of $i_{COMP}$ and $i_{FB}$ flows through the feedback resistor 505, producing a voltage drop of $V_{FB+COMP}$. $V_{FB+COMP}$ is provided to the inverting terminal of the comparator 128.

As above, the value of $R_{COMP}$ determines the leading-edge amplitude of the semi-square wave, since a lower $R_{COMP}$ value will increase the $i_{COMP}$ offset, increasing the offset of $V_{FB+COMP}$. Similarly, when the RUN signal is not enabled, and thus the switching element 404 is off, the RC time constant of the resistor 408 and the capacitor 406 determines the rate of decay of $i_{COMP}$, which determines the trailing-edge slope or decay profile.

FIG. 5b shows a set of waveforms 550 associated with various aspects of FIG. 5a. The first waveform 552 corresponds to $V_{FB+COMP}$, which is shown relative to the reference voltage $V_{FB(REF)}$. The second waveform 554 shows $i_{COMP}$ while the third waveform 556 shows $i_{FB}$. The fourth waveform 558 shows the output voltage $V_O$ relative to the regulation target voltage $V_{O(ref)}$. The fifth waveform 560 corresponds to the PWM signal, while the sixth waveform 562 corresponds to the RUN signal.

In the example of FIG. 5b, the burst length is three pulses. In other words, the output of the counter 142 is triggered after three clock pulses are received from the clock generator (not shown) while the RUN signal is enabled. In this example, as a result of $V_{FB+COMP}$ being provided to the inverting terminal, at time 570 when $V_{FB+COMP}$ reaches or just falls below $V_{FB(REF)}$, the set-reset latch 130 is set and the RUN signal is enabled. When the RUN signal is enabled, the switching element 404 is turned on and a current equal to $i_{COMP}+i_{FB}$ flows from each leg of the current mirror 503. In the example of FIG. 5a, a feedback resistor 505 is coupled between the current mirror 503 and ground, and thus the sum of $i_{COMP}$ and $i_{FB}$ flows through the feedback resistor 505, increasing $V_{FB+COMP}$ as the current increases. At time 572, the counter 142 is tripped, resetting the set-reset latch 130, and the RUN signal goes low, which in turn forces PWM low. During this time, $i_{COMP}$ decays according to the RC time constant of the compensation resistor 408 and the capacitor 406, while $i_{FB}$ decays along with $V_O$. As a result, the voltage across the feedback resistor 426 decreases, and thus $V_{FB+COMP}$ decreases until it again reaches or just falls below $V_{FB(REF)}$ at time 574, at which point the above-described cycle repeats itself.

In some examples, the ripple compensation circuits 402 of FIGS. 4a and 5a are implemented as circuitry external to the burst mode controller 106. For example, in order to establish the appropriate RC time constant for a desired trailing-edge slope or decay profile, the junction capacitance of the switching element 404 may need to be sufficiently large. The physical size of the switching element 404 with such a sufficiently large junction capacitance also increases, such that integrating the ripple compensation circuit 402 with the burst mode controller 106 would occupy more die area than may be desirable. As such, in at least some examples, the ripple compensation circuit 402 is implemented externally (e.g., as a separate integrated circuit (IC)) and coupled to the burst mode controller 106 as shown.

Figure 6A:
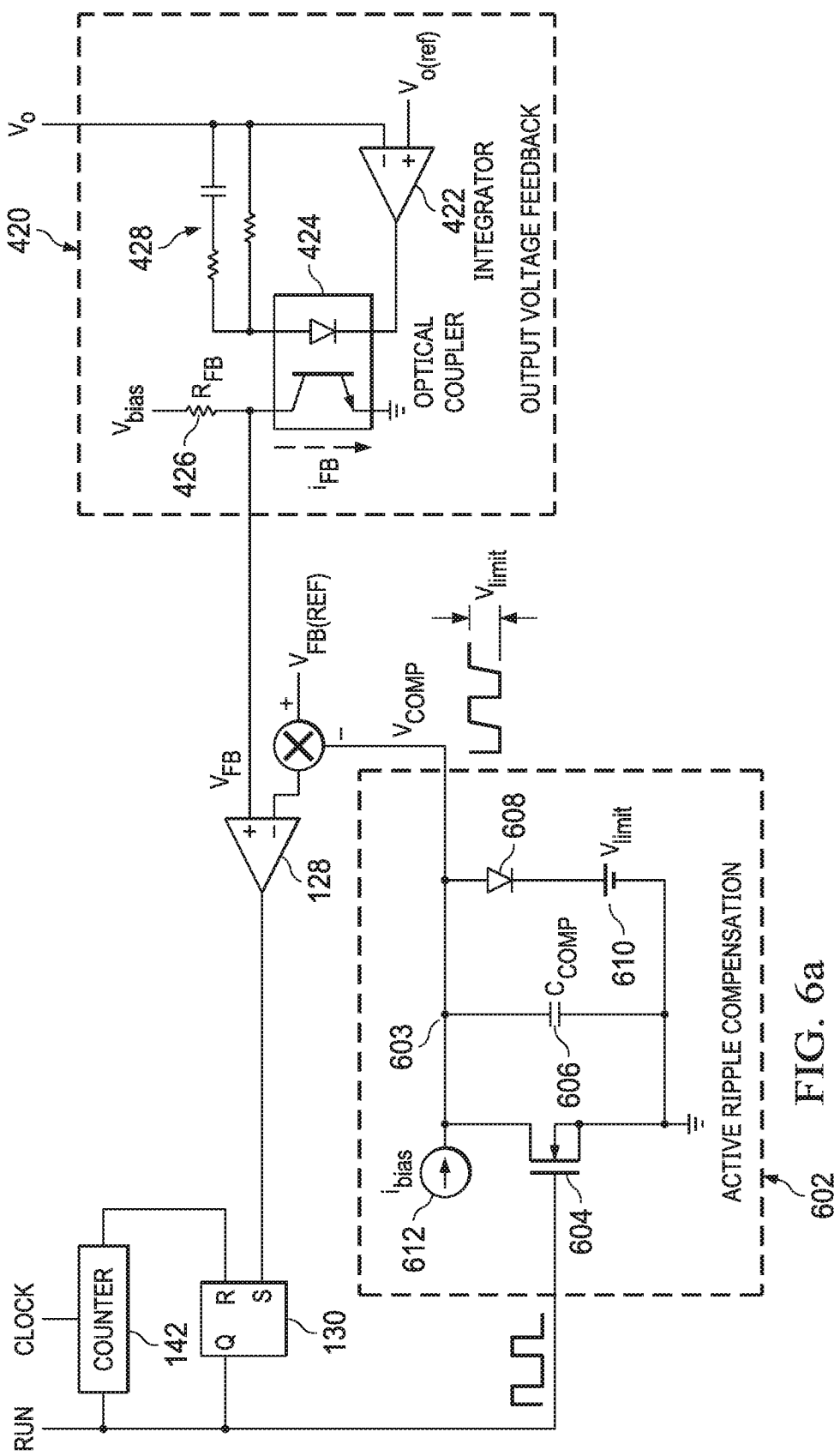
FIG. 6a shows a circuit schematic diagram of a third implementation of a ripple compensation scheme in accordance with various examples.

FIG. 6a shows another example ripple compensation circuit 602 in further detail, which is representative of the ripple compensation circuits 202, 302 explained above. Additionally, FIG. 6a includes the output voltage feedback circuit 420 described with respect to FIG. 4a. The ripple compensation circuit 602 includes a switching element 604, which in this example is an n-type MOSFET having its source coupled to ground, its gate coupled to the non-inverting Q output of latch 130, and its drain coupled to a node 603. The voltage at the node 603 is given by $V_{COMP}$.

The ripple compensation circuit 602 also includes a capacitor 606 coupled between the node 603 and ground. In one example, the capacitor 606 is a separate element from the n-type MOSFET 604, while in another example, the capacitor 606 is a representation of the junction capacitance of the n-type MOSFET 604. In other examples, the switching element 604 is a NPN bipolar junction transistor (BJT) having its base coupled to the non-inverting Q output of latch 130, its collector coupled to the node 603, and its emitter coupled to ground. The ripple compensation circuit 602 also includes a diode 608 and a voltage source 610 (together a voltage limiter) coupled between the node 603 and ground, and a current source 612 that delivers a bias current $i_{bias}$ to the node 603. The voltage source 610 provides a limiting voltage having a value of $V_{limit}$.

Similar to above, the optocoupler 424 generates a feedback current signal, the value of which is $i_{FB}$, having a magnitude proportional to the magnitude of the error between $V_O$ and $V_{O(ref)}$. The feedback resistor 426 is a pull-up resistor in this example and is coupled to a bias voltage source ($V_{bias}$) and to the optocoupler 424. The feedback resistor 426 value is given by $R_{FB}$ and thus the voltage drop across the feedback resistor 426 is $V_{FB}$, which is provided to the non-inverting terminal of the comparator 128. As in FIG. 4a, $V_{FB}$ is less than $V_{bias}$ as a result of the feedback resistor 426 being a pull-up resistor. In some examples, $V_{bias}$ is larger than $V_{FB(REF)}$ to provide sufficient headroom so that as $i_{FB}$ trends toward zero (when RUN is not enabled), $V_{FB}$ trends toward $V_{bias}$, which trips the comparator 128 when $V_{FB}$ is greater than $V_{FB(REF)} - V_{COMP}$.

When the RUN signal is enabled, the switching element 604 turns on and a voltage across the capacitor 606, $V_{COMP}$, falls from a maximum clamped voltage of $V_{limit}$ to 0V. Thus, the value of $V_{limit}$ determines the leading-edge amplitude of the semi-square wave subtracted from $V_{FB(REF)}$. When the RUN signal is not enabled, the trailing-edge slope or decay profile of the semi-square wave subtracted from $V_{FB(REF)}$ is determined by the bias current $i_{bias}$ from the current source 612 charging the capacitor 606 to $V_{limit}$.

Figure 6B:
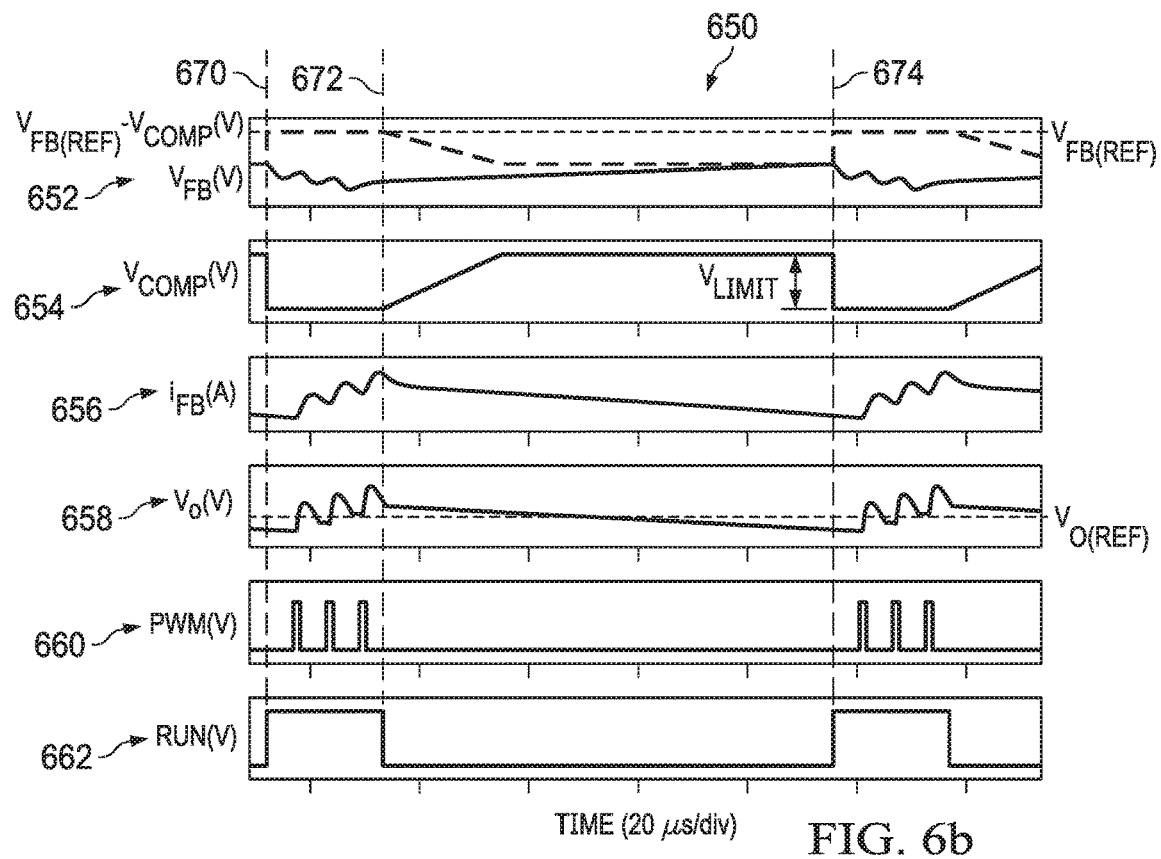
FIG. 6b shows a set of waveforms associated with FIG. 6a in accordance with various examples.

FIG. 6b shows a set of waveforms 650 associated with various aspects of FIG. 6a. The first waveform 652 corresponds to $V_{FB}$, which is shown relative to the reference voltage $V_{FB(REF)}$ as well as the result of subtracting $V_{COMP}$ from $V_{FB(REF)}$. The second waveform 654 shows $V_{COMP}$ while the third waveform 656 shows $i_{FB}$. The fourth waveform 658 shows the output voltage $V_O$ relative to the regulation target voltage $V_{O(ref)}$. The fifth waveform 660 corresponds to the PWM signal, while the sixth waveform 662 corresponds to the RUN signal.

In the example of FIG. 6b, the burst length is three pulses. In other words, the output of the counter 142 is triggered after three clock pulses are received from the clock generator (not shown) while the RUN signal is enabled. In this example, as a result of $V_{FB}$ being provided to the non-inverting terminal, at time 670 when $V_{FB}$ reaches or just exceeds $V_{FB(REF)} V_{COMP}$, the set-reset latch 130 is set and the RUN signal is enabled. When the RUN signal is enabled, the n-type MOSFET 604 is turned on and $V_{COMP}$ falls from a maximum clamped voltage of $V_{limit}$ to 0V, which has the effect of shifting the inverting terminal value of $V_{FB(REF)} - V_{COMP}$ higher and away from $V_{FB}$. At time 672, the counter 142 is tripped, resetting the set-reset latch 130, and the RUN signal goes low, which in turn forces PWM low. During this time, the current source 612 charges the capacitor 606 to $V_{limit}$, which increases $V_{COMP}$ while decreasing the inverting terminal value of $V_{FB(REF)} V_{COMP}$. At the same time, $i_{FB}$ decays along with $V_O$, which decreases the voltage drop across the feedback resistor 426. Thus, $V_{FB}$ increases until it again reaches or just exceeds $V_{FB(REF)} - V_{COMP}$ at time 674, at which point the above-described cycle repeats itself.

Figure 7B:
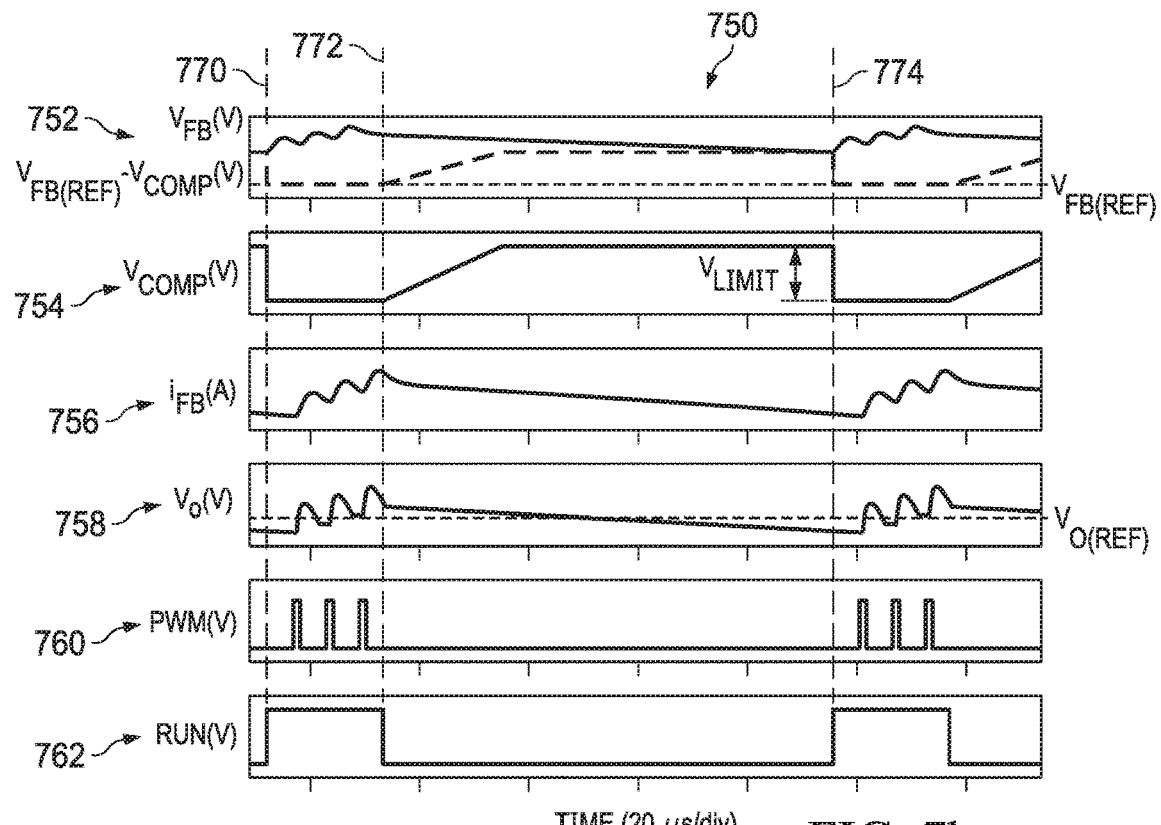
FIG. 7b shows a set of waveforms associated with FIG. 7a in accordance with various examples.
Figure 7A:
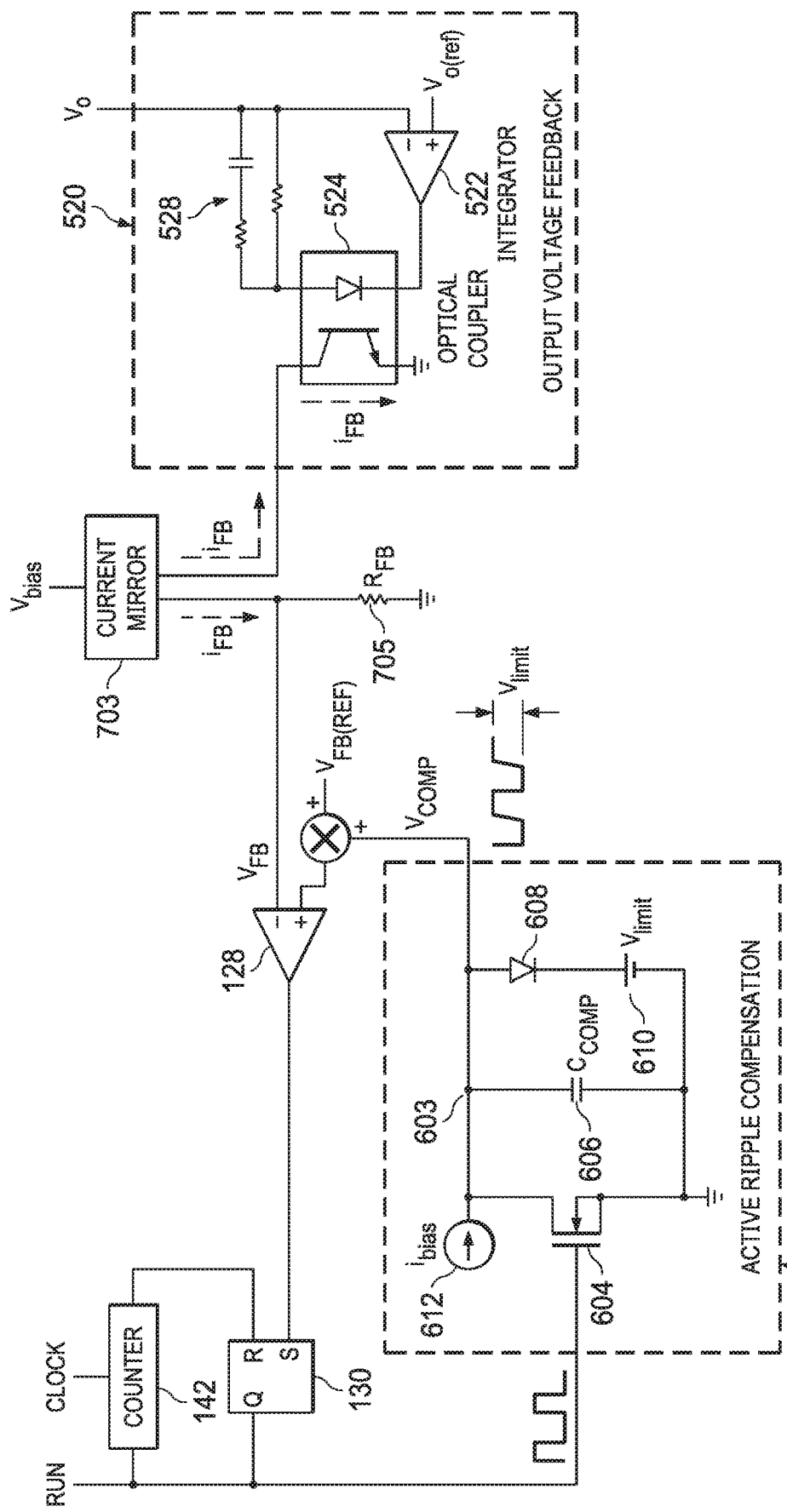
FIG. 7a shows a circuit schematic diagram of a fourth implementation of a ripple compensation scheme in accordance with various examples.

FIG. 7a shows the ripple compensation circuit 602 of FIG. 6a in a different implementation. The circuit 602 behaves similarly as described above. Additionally, FIG. 7a includes the output voltage feedback circuit 520 described with respect to FIG. 5a. In the example of FIG. 7a, the output voltage feedback circuit 520 is coupled to one leg of a current mirror 703, which is supplied with a bias voltage ($V_{bias}$). Similar to above, the optocoupler 524 generates a feedback current signal, the value of which is $i_{FB}$, having a magnitude proportional to the magnitude of the error between $V_O$ and $V_{O(ref)}$. As a result, $i_{FB}$ flows from each leg of the current mirror 703. In the example of FIG. 7a, a feedback resistor 705 is coupled between the current mirror 703 and ground, and thus $i_{FB}$ flows through the feedback resistor 705, producing a voltage drop of $V_{FB}$. $V_{FB}$ is provided to the inverting terminal of the comparator 128.

As above, the value of $V_{limit}$ determines the leading-edge amplitude of the semi-square wave added to $V_{FB(REF)}$, since the voltage across the capacitor 606, $V_{COMP}$, falls from a maximum clamped voltage of $V_{limit}$ to 0V when the RUN signal is enabled. Similarly, when the RUN signal is not enabled, the trailing-edge slope or decay profile is determined by the bias current $i_{bias}$ from the current source 612 charging the capacitor 606 to $V_{limit}$.

FIG. 7b shows a set of waveforms 750 associated with various aspects of FIG. 7a. The first waveform 752 corresponds to $V_{FB}$, which is shown relative to the reference voltage $V_{FB(REF)}$ as well as the result of adding $V_{COMP}$ to $V_{FB(REF)}$. The second waveform 754 shows $V_{COMP}$ while the third waveform 756 shows $i_{FB}$. The fourth waveform 758 shows the output voltage $V_O$ relative to the regulation target voltage $V_{O(ref)}$. The fifth waveform 760 corresponds to the PWM signal, while the sixth waveform 762 corresponds to the RUN signal.

In the example of FIG. 7b, the burst length is three pulses. In other words, the output of the counter 142 is triggered after three clock pulses are received from the clock generator (not shown) while the RUN signal is enabled. In this example, as a result of $V_{FB}$ being provided to the inverting terminal, at time 770 when $V_{FB}$ reaches or just falls below $V_{FB(REF)} + V_{COMP}$, the set-reset latch 130 is set and the RUN signal is enabled. When the RUN signal is enabled, the n-type MOSFET 604 is turned on and $V_{COMP}$ falls from a maximum clamped voltage of $V_{limit}$ to 0V, which has the effect of shifting the non-inverting terminal value of $V_{FB(REF)} + V_{COMP}$ lower and away from $V_{FB}$. At time 772, the counter 142 is tripped, resetting the set-reset latch 130, and the RUN signal goes low, which in turn forces PWM low. During this time, the current source 612 charges the capacitor 606 to $V_{limit}$, which increases $V_{COMP}$ and the non-inverting terminal value of $V_{FB(REF)} + V_{COMP}$. At the same time, $i_{FB}$ decays along with $V_O$, which decreases the voltage drop across the feedback resistor 705. Thus, $V_{FB}$ decreases until it again reaches or just falls below $V_{FB(REF)} + V_{COMP}$ at time 774, at which point the above-described cycle repeats itself.

In some examples, the ripple compensation circuits 602 of FIGS. 6a and 7a are implemented as circuitry integrated into the burst mode controller 106. For example, since a current source 612 charging a capacitor 606 is used in place of an RC time constant to determine the trailing edge profile, the impact on the die area is less than the examples of FIGS. 4a and 5a, as explained above.

The foregoing examples address the low SNR of a feedback voltage in burst-mode power converters, which can cause irregular bursts of pulses, grouping of bursts of pulses too close together, audible noise in excess of noise regulations, and increases in output voltage ripple. In the foregoing discussion and in the claims, reference is made to a burst-mode controller and an associated ripple compensation circuit. The various circuit elements correspond to hardware circuitry, for example implemented on an integrated circuit (IC). In at least one example, the burst-mode controller and ripple compensation circuit are implemented on an IC, while in another example the ripple compensation circuit is implemented on an IC separate from the burst-mode controller.

In the foregoing discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections. Similarly, a device that is coupled between a first component or location and a second component or location may be through a direct connection or through an indirect connection via other devices and connections. An element or feature that is "configured to" perform a task or function may be configured (e.g., programmed or structurally designed) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Additionally, uses of the phrases "ground" or similar in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, "about," "approximately," or "substantially" preceding a value means+/−10 percent of the stated value.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A device, comprising:
a pulse generation circuit configured to cause a primary side of a flyback converter to generate a burst of pulse while a signal is enabled;
a set-reset latch configured to output the signal and to reset in response to a number of pulse in the burst approaching a threshold;
a comparator configured to set the set-reset latch when a compensated feed back voltage reaches a reference voltage; and
a ripple compensation circuit configured to adjust a feedback voltage from a secondary side of the flyback converter by a compensation voltage based on the signal to generate the compensated feedback voltage, wherein the ripple compensation circuit is configured to:
receive the signal as an input; and
generate the compensation voltage when the signal is enabled.

2. The device of claim 1, wherein the compensation voltage comprises a semi-square waveform.

3. The device of claim 1, wherein an amplitude of the compensation voltage is variable based on a resistance value of a compensation resistor of the ripple compensation circuit.

4. The device of claim 1, wherein a decay rate of the compensation voltage when the signal is no longer enabled is variable based on a resistor-capacitor time constant of the ripple compensation circuit.

5. A device, comprising:
a set-reset latch comprising:
an output coupled to a counter;
a set input; and
a reset input coupled to the counter;
a ripple compensation circuit, comprising:
a switching element having a control terminal coupled to the output of the set-reset latch;
a capacitor in parallel with the switching element; and
a first resistor coupled to the switching element and the capacitor;
an output voltage feedback circuit configured to couple to a flyback converter, the output voltage feedback circuit comprising an optocoupler coupled to the first resistor; and
a comparator comprising:
a first input coupled to a first voltage source;
a second input coupled to the first resistor and a second resistor; and
an output coupled to the set input of the set-reset latch.

6. The device of claim 5, wherein the switching element comprises a bipolar junction transistor (BJT) having a base coupled to the output of the set-reset latch, a collector coupled to the first resistor, and an emitter coupled to ground.

7. The device of claim 5, wherein the switching element comprises a n-type metal-oxide-semiconductor field effect transistor (MOSFET) having a gate coupled to the output of the set-reset latch, a source coupled to ground, and a drain coupled to the first resistor.

8. The device of claim 5, wherein:
the second resistor is coupled to the optocoupler and a second voltage source;
the first resistor is coupled to a node between the optocoupler and the second resistor; and
the second input of the comparator is coupled to the node.

9. The device of claim 8, wherein the first input comprises an inverting input and the second input comprises a non-inverting input.

10. The device of claim 5, wherein:
the first resistor is coupled to a node between a first leg of a current mirror and the optocoupler;
the second resistor is coupled to a second leg of the current mirror and ground; and
the second input of the comparator is coupled to a node between the current mirror and the feedback resistor.

11. The device of claim 10, wherein the first input comprises a non-inverting input and the second input comprises an inverting input.

12. A device, comprising:
a set-reset latch comprising:
an output coupled to a counter;
a set input; and
a reset input coupled to the counter;

a ripple compensation circuit, comprising:
  a switching element having a control terminal coupled to the output of the set-reset latch;
  a capacitor;
  a voltage limiter, wherein the switching element, the capacitor, and the voltage limiter are arranged in parallel between a first node and ground; and
  a current source coupled to the first node; and
a comparator comprising:
  a first input coupled to a first voltage source and the first node;
  a second input coupled to a first resistor; and
  an output coupled to the set input of the set-reset latch.

13. The device of claim 12, wherein the switching element comprises a bipolar junction transistor (BJT) having a base coupled to the output of the set-reset latch, a collector coupled to the first node, and an emitter coupled to ground.

14. The device of claim 12, wherein the switching element comprises a n-type metal-oxide-semiconductor field effect transistor (MOSFET) having a gate coupled to the output of the set-reset latch, a source coupled to ground, and a drain coupled to the first node.

15. The device of claim 12, further comprising an output voltage feedback circuit configured to couple to a flyback converter, the output voltage feedback circuit comprising an optocoupler coupled to the second input, wherein:
  the first resistor is coupled to a second voltage source;
  the second input is coupled to a second node between the optocoupler and the first resistor; and
  a voltage at the first input comprises a voltage of the first voltage source minus a voltage at the first node.

16. The device of claim 15, wherein the first input comprises an inverting input and the second input comprises a non-inverting input.

17. The device of claim 12, further comprising:
  a current mirror having first and second legs;
  an output voltage feedback circuit configured to couple to a flyback converter, the output voltage feedback circuit comprising an optocoupler coupled to the first leg, wherein:
    the first resistor is coupled to the second leg;
    the second input is coupled to a second node between the second leg and the first resistor; and
    a voltage at the first input comprises a voltage of the first voltage source plus a voltage at the first node.

18. The device of claim 17, wherein the first input comprises a non-inverting input and the second input comprises an inverting input.

* * * * *